United States Patent [19]

Welbourn et al.

[11] Patent Number: 4,801,556
[45] Date of Patent: Jan. 31, 1989

[54] SELF-ALIGNED BIPOLAR FABRICATION PROCESS

[75] Inventors: Anthony D. Welbourn, Ipswich; Christopher J. H. Heslop, Woodbridge, both of England

[73] Assignee: British Telecommunications Public Limited Company, United Kingdom

[21] Appl. No.: 93,667

[22] Filed: Sep. 8, 1987

[30] Foreign Application Priority Data

Sep. 8, 1986 [GB] United Kingdom ............... 8621534

[51] Int. Cl.⁴ .......................................... H01L 21/265
[52] U.S. Cl. ....................................... 437/32; 437/33; 437/917; 148/DIG. 10; 148/DIG. 11; 148/DIG. 124; 357/35; 357/59
[58] Field of Search .................. 437/917, 32, 31, 33, 437/235, 238, 241, 245; 148/DIG. 124, DIG. 10, DIG. 11; 357/35, 59 H

[56] References Cited

U.S. PATENT DOCUMENTS 4,338,138 7/1982 Cavaliere et al. .................. 437/69
4,492,008 1/1985 Anantha et al. .................. 437/917

FOREIGN PATENT DOCUMENTS 0036499 3/1987 European Pat. Off. .

OTHER PUBLICATIONS

IBM Technical Disclosure Bulletin, vol. 24, No. 3, Aug. 1981, pp. 1745–1746, New York, U.S.; I. Antipov: "Method for Making Laterial PNP Devices".

Primary Examiner—Brian E. Hearn
Assistant Examiner—M. Wilczewski
Attorney, Agent, or Firm—Nixon & Vanderhye

[57] ABSTRACT

Regions of the substrate which are to be the collector sinker and the active area of a bipolar transistor are isolated by forming a trench about them and filling it with a dielectric. The dielectric can be oxide formed in a LOCOS process. A dielectric body, which may be nitride, is formed on part of the active area, and base contacts implanted using it as a mask. Polysilicon is deposited over the whole and then cut to form future metallization-to-base contacts. The dielectric body is removed and the base implanted through the resulting aperture. Oxide spacers are formed on the sidewall of the aperture and polysilicon deposited. The polysilicon is doped and used to produce the emitter by driving the dopant into the substrate between the oxide spacers.

4 Claims, 2 Drawing Sheets

SELF-ALIGNED BIPOLAR FABRICATION PROCESS

BACKGROUND OF THE INVENTION

1. Field of the Invention

This invention relates to bipolar semiconductor devices and to processes for their fabrication.

2. Description of Related Art

Bipolar devices fabricated using known processes are limited in terms of performance by base resistance and capacitance. If the performance of bipolar devices is to be improved, it will be necessary to reduce the area of the base. Considerable attention has already been given to the reduction of base area and the scope for further reduction is severely limited by alignment tolerances for the base and emitter contacts and the limits of resolution of the lithographic process. Consequently there exists a need for an improved fabrication process which will enable the fabrication of bipolar devices having bases of reduced area without the need to define small device dimensions lithographically.

SUMMARY OF THE INVENTION

The present invention seeks to provide an improved fabrication method by means of which the base contact area can be reduced with consequent improvements in device performance. Throughout this specification the term 'substrate', unless the context clearly requires otherwise, is used to refer to the semiconductor in which the active areas of the transistor are grown and includes any epitaxial semiconductor layers in which active areas are formed.

According to a first aspect of the present invention there is provided a method of fabricating a bipolar transistor comprising emitter, base and collector regions in a semiconductor substrate, the method comprising the steps of:

(a) forming a dielectric layer on the surface of the substrate;

(b) etching the dielectric and the underlying substrate to produce a recess about the areas of substrate which are to form the active area and the collector sinker of the transistor;

(c) filling the recess by forming a dielectric layer therein;

(d) forming on the surface of the substrate a further dielectric layer;

(e) etching said further dielectric layer to leave a body of dielectric over part of the said area of substrate which is to form the active area;

(f) forming base contacts in the substrate adjacent said body;

(g) forming a layer of conductive material on the substrate about and in physical contact with said body;

(h) removing said body and implanting the base region in the substrate through the opening left in the conductive material by the removal of the body.

BRIEF DESCRIPTION OF THE DRAWINGS

Embodiments of the present invention will now be described with reference to the accompanying drawings in which.

DESCRIPTION OF THE PREFERRED EMBODIMENTS

Figure 1:
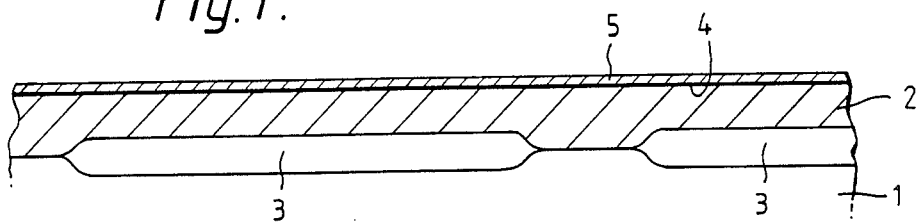
FIGS. 1 to 8 are diagrammatic cross-sections through a device according to the invention at various stages of its production.
Figure 2:
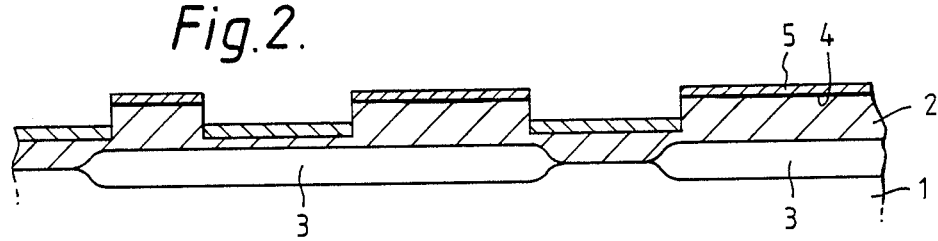

The starting point for the process according to the invention is a p-type silicon substrate as conventionally prepared for bipolar circuits with buried layers. FIG. 1 shows such a precursor with a p-type substrate (1), 1–1.5 $\mu$m thick n-type epitaxial layer (2) and an n+ buried layer (3) at the interface therebetween. A thin oxide layer (4), 10–30 nm thick, is formed on the epitaxial layer. A nitride layer (5) approximately 200 nm thick is formed over the oxide layer (4). The nitride layer (5) is then cut to expose the silicon of the epitaxial layer apart from in those areas which will subsequently form the collector sinker and the active area. The exposed silicon is then removed by plasma etching to a depth of about 0.5 to 0.7 um. The structure at this stage is as shown in FIG. 2.

Figure 3:
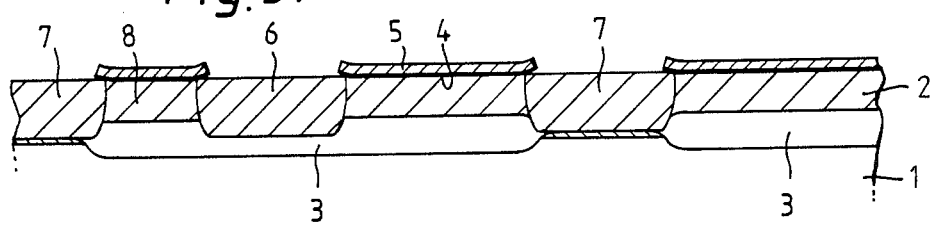

Boron is implanted into the exposed silicon to form a channel stopper. The exposed silicon is then oxidised using, for example, the LOCOS process to give oxide islands (6 an d7) taking the place of the etched silicon. Oxide is grown until its upper surface is approximately at the level of the upper surface of the epitaxial silicon layer. During the oxidation step, boron diffuses towards the substrate, thereby providing device isolation. At this point, the device structure is as shown in FIG. 3.

Figure 4:
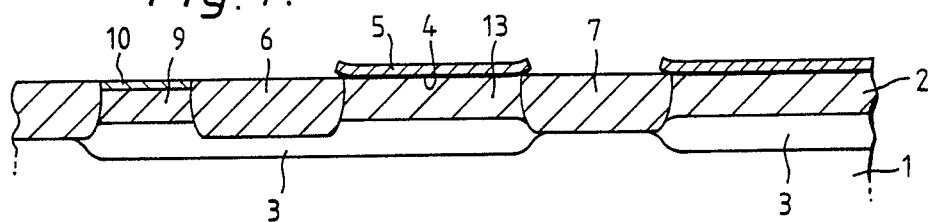

The nitride and thin oxide is then stripped from the area (8) which is to become the collector sinker. The collector contact is implanted with antimony or arsenic to produce a region of n+ semiconductor. A thin oxide coating (10) is grown over the collector contact (9). The structure at this point is as shown in FIG. 4.

Figure 5:
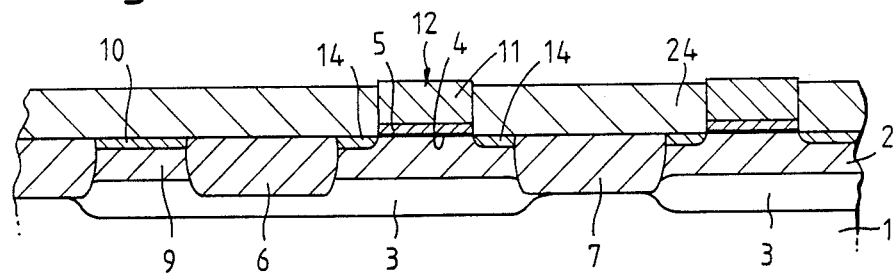

A 0.5–1.0 $\mu$m thick nitride layer (11) is next deposited. This thick nitride layer is patterned and cut to leave a substitute emitter (12) on the thin nitride layer (5) which covers the active area (13) of the device. The active area adjacent the substitute emitter (12) is then implanted with, for example, boron to produce p+ regions (14) near the surface of the silicon of the active area. The thin oxide layer (4) over the active area is stripped either before or after this boron implant, but before deposition of the polysilicon layer which is to be deposited next. Polysilicon is deposited conformally to a depth of about 0.5 to 1 $\mu$m. If the low resistance properties of silicide are sought, a thin layer of a metal (Ti, Co, W, Pt, Mo, Ta) is deposited over the polysilicon and reacted to form a silicide. The resulting polycide (24) is then planarized to produce a structure as shown in FIG. 5.

Figure 6:
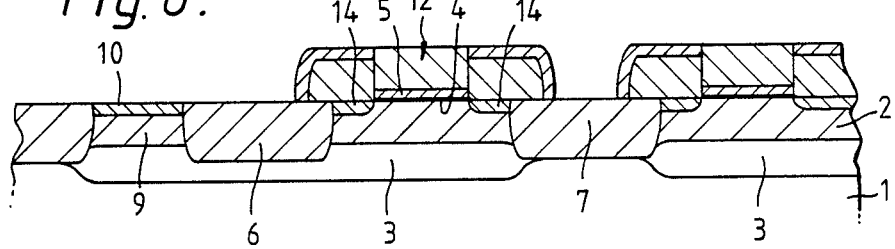

The polycide (24) is patterned and etched away everywhere except over the active area and over part of the adjoining oxide islands (6 and 7) to leave polycide/-polysilicon base contacts which are then oxidised to a depth of about 200 nm. During the oxidation step the thickness of the oxide on the collector contact is of course increased. The structure at this stage is as shown in FIG. 6.

Figure 7:
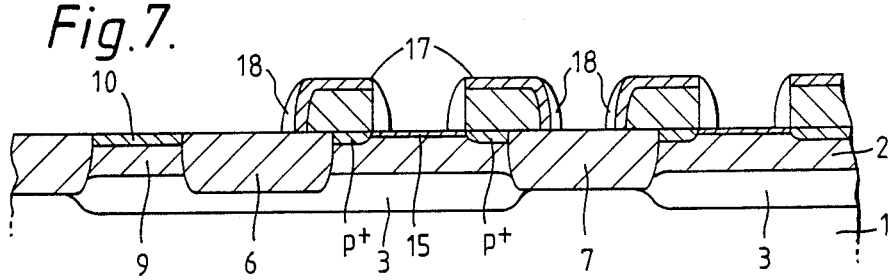
Figure 8:
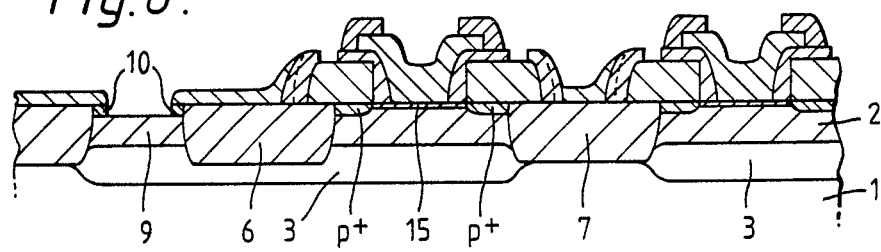

Next, the substitute emitter is removed by etching. The base region (15) is then implanted through the opening left by removal of the substitute emitter with p-type impurities either through the thin oxide layer (4) or after its removal. A layer (16) of oxide is then formed and cut to produce sidewall spacers (17 and 18) on either side of the polysilicon contacts. The structure at this stage is as shown in FIG. 7.

An n+ polysilicon emitter contact is formed by depositing, doping (during or after deposition) and cutting a polysilicon layer. A short anneal is performed and the n-type dopant diffuses from the polysilicon into the single crystal silicon to form a shallow emitter. Further processing, including deposition of another dielectric layer, the cutting of contacts and metallization is conventional.

We claim:

1. A method of fabricating a bipolar transistor comprising emitter, base and collector regions in a semiconductor substrate, the method comprising the steps of:
   (a) forming a dielectric layer on the surface of the substrate;
   (b) etching the dielectric and the underlying substrate to produce a recess about the areas of substrate which are to form the active area and the collector sinker of the transistor;
   (c) filling the recess by forming a dielectric layer therein;
   (d) forming on the surface of the substrate a further dielectric layer;
   (e) etching said further dielectric layer to leave a body of dielectric over part of the said area of substrate which is to form the active area;
   (f) forming base contacts by direct implantation of boron into the substrate adjacent said body;
   (g) subsequent to step f, forming a layer of conductive material in the substrate about and; in physical contact with said body; and
   (h) removing said body and implanting the base region in the substrate through the opening left in the conductive material by the removal of the body.

2. A method as claimed in claim 1 comprising the further steps of:
   (i) forming non-lithographically, an annular body of dielectric around the inner periphery of the sidewall of the opening left in the conductive layer by the removal of the body;
   (j) depositing a further layer of a conductive material to contact the substrate within the inner periphery of said annular body; and
   (k) forming the emitter by driving a dopant from said further layer of conductive material into the substrate.

3. A method as claimed in claim 1 or claim 2 wherein the dielectric layer within the recess is formed by local oxidation of the substrate silicon, and said further dielectric layer comprises silicon nitride.

4. A method as claimed in claims 1 or 2 wherein the conductive layers comprise polysilicon.

* * * * *